(12) United States Patent
Crocherie

(10) Patent No.: US 11,791,355 B2
(45) Date of Patent: Oct. 17, 2023

(54) IMAGE SENSOR

(71) Applicant: STMicroelectronics (Crolles 2) SAS, Crolles (FR)

(72) Inventor: Axel Crocherie, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 239 days.

(21) Appl. No.: 17/077,966

(22) Filed: Oct. 22, 2020

(65) Prior Publication Data

US 2021/0126034 A1    Apr. 29, 2021

(30) Foreign Application Priority Data

Oct. 24, 2019 (FR) ...................................... 1911935

(51) Int. Cl.
  *H01L 27/146*    (2006.01)
(52) U.S. Cl.
  CPC .... *H01L 27/14627* (2013.01); *H01L 27/1463* (2013.01); *H01L 27/14607* (2013.01); *H01L 27/14685* (2013.01); *H01L 27/1462* (2013.01)
(58) Field of Classification Search
  None
  See application file for complete search history.

(56) References Cited

U.S. PATENT DOCUMENTS

| | | | |
|---|---|---|---|
| 2004/0180461 A1* | 9/2004 | Yaung | H01L 27/14685 438/48 |
| 2005/0274988 A1 | 12/2005 | Hong | |
| 2010/0178018 A1* | 7/2010 | Augusto | H01L 27/14621 385/131 |
| 2012/0273652 A1 | 11/2012 | Lenchenkov | |
| 2015/0340391 A1* | 11/2015 | Webster | H01L 27/1464 257/432 |
| 2018/0083057 A1 | 3/2018 | Crocherie et al. | |
| 2019/0067357 A1* | 2/2019 | Cheng | H01L 27/14645 |
| 2019/0237501 A1* | 8/2019 | Mu | H01L 27/14685 |

FOREIGN PATENT DOCUMENTS

DE    10 2018 108 794 B3    5/2019

* cited by examiner

*Primary Examiner* — Ali Naraghi
(74) *Attorney, Agent, or Firm* — SEED INTELLECTUAL PROPERTY LAW GROUP LLP

(57) ABSTRACT

An image sensor is includes a plurality of pixels. Each of the pixels includes a silicon photoconversion region and a material that at least partially surrounds the photoconversion region. The material has a refraction index smaller than the refraction index of silicon, and the interface between the photoconversion region of the pixel and the material is configured so that at least one ray reaching the photoconversion region of the pixel undergoes a total reflection or a plurality of successive total reflections at the interface.

17 Claims, 5 Drawing Sheets

IMAGE SENSOR

BACKGROUND

Technical Field

The present disclosure generally concerns image sensors, and more particularly image sensors configured to capture the image of a scene in near-infrared.

Description of the Related Art

Sensors comprising pixels formed from a silicon wafer or substrate are known. In such sensors, each pixel comprises a silicon photoconversion region corresponding to a portion of the substrate.

When such sensors are used to obtain an image of a scene in near infrared, due to the fact the silicon absorbs little light in near infrared, only a very small portion of the optical power of a ray reaching the photoconversion region of a pixel is absorbed by the silicon of this photoconversion region. For example, less than 6% of the optical power of a light ray having a wavelength around 940 nm and reaching a silicon photoconversion region having a 3-μm thickness is absorbed. Further, the optical power of the ray which is not absorbed by the silicon of the pixel may be transmitted to the photoconversion regions of neighboring pixels, possibly after having come out of the pixel and having been reflected on various interfaces of the sensor, for example, on a lens of an objective of the sensor or on a filter. This results in obtaining images comprising many defects, artifacts, or parasitic images.

BRIEF SUMMARY

There is a need to improve known image sensors, and in particular to increase the absorption of infrared rays in photoconversion regions of the sensor pixels.

An embodiment overcomes all or part of the disadvantages of known light sensors, particularly of known image sensors.

An embodiment provides an image sensor comprising pixels, each comprising a silicon photoconversion region surrounded with at least one material having a refraction index smaller than the refraction index of silicon, the interface between the photoconversion region of the pixel and said material being configured so that at least one ray reaching the photoconversion region of the pixel undergoes a total reflection on this interface or a plurality of successive total reflections on this interface.

According to an embodiment, the photoconversion region of each pixel extends upwardly from a rear surface intended to receive said at least one ray all the way to a front surface parallel and opposite to the rear surface and extends laterally between four lateral surfaces, the photoconversion region further comprising:
  a first oblique surface coupling a first one of the four lateral surfaces to the front surface;
  a second oblique surface coupling the front surface to a second one of the four lateral surfaces opposite to the first lateral surface; and
  a third oblique surface coupling the second lateral surface to the rear surface.

According to an embodiment, in each pixel:
  a first angle between the first oblique surface and the front surface is greater than the limiting angle of total reflection on an interface between silicon and said material;
  a second angle between the second oblique surface and the front surface is greater than said limiting angle; and
  a third angle between the third oblique surface and the rear surface is greater than said limiting angle.

According to an embodiment, in each pixel, the first angle is further smaller than 90° minus the value of the limiting angle.

According to an embodiment, the photoconversion region of each pixel further comprises a fourth oblique surface coupling the rear surface to the first lateral surface.

According to an embodiment, in each pixel, a fourth angle between the fourth oblique surface and the rear surface is greater than the limiting angle.

According to an embodiment, said oblique surfaces are configured so that the successive total reflections occur at the level of said oblique surfaces, preferably the first oblique surface being the first one of said oblique surfaces reached by said at least one ray.

According to an embodiment, the sensor further comprises a silicon substrate comprising a first main surface and a second main surface parallel and opposite to the first main surface, and:
  each photoconversion region corresponds to a portion of said substrate;
  the front surface of each photoconversion region corresponds to a portion of the first main surface; and
  the rear surface of each photoconversion region corresponds to a portion of the second main surface.

According to an embodiment, each pixel comprises a microlens arranged above the rear surface of the photoconversion region of the pixel, the microlens being configured so that said at least one ray reaches the first oblique surface, preferably with a non-zero angle relative to the normal to said rear surface.

According to an embodiment, in each pixel, a layer of said material covers the rear surface of the photoconversion region.

According to an embodiment, in each pixel, an antireflection layer portion rests on top of and in contact with a portion only of the rear surface of the photoconversion region, said antireflection layer portion being arranged to be crossed by said at least one ray.

According to an embodiment, said material is silicon oxide.

According to an embodiment, said at least one light ray of each pixel has a wavelength in near infrared, for example, a wavelength in the range from 700 to 1,000 nm.

According to an embodiment, the sensor further comprises an objective arranged above the rear surfaces of the photoconversion regions, opposite the pixels and, for each pixel, said at least one ray corresponds to the chief ray of the pixel.

Another embodiment provides a method comprising the successive steps of:
  etching, on the side of a first surface of a silicon substrate, first trenches having opposite oblique walls meeting at the bottom of the first trenches;
  etching, on the side of the first surface of the substrate, second trenches laterally delimiting photoconversion regions of the sensor pixels, the bottom of each first trench being crossed by a second corresponding trench aligned with said first trench;
  filling the first and second trenches with at least one material having a refraction index smaller than the refraction index of silicon;
  etching, on the side of a second surface of the substrate opposite and parallel to the first surface, third trenches having opposite oblique walls meeting at the bottom of the third trenches, each third trench being arranged opposite a corresponding first trench and the bottom of each third trench being arranged in the material filling a corresponding second trench; and filling the third trenches with said at least one material.

The foregoing and other features and advantages will be discussed in detail in the following non-limiting description of specific embodiments in connection with the accompanying drawings.

DETAILED DESCRIPTION

Figure 1:
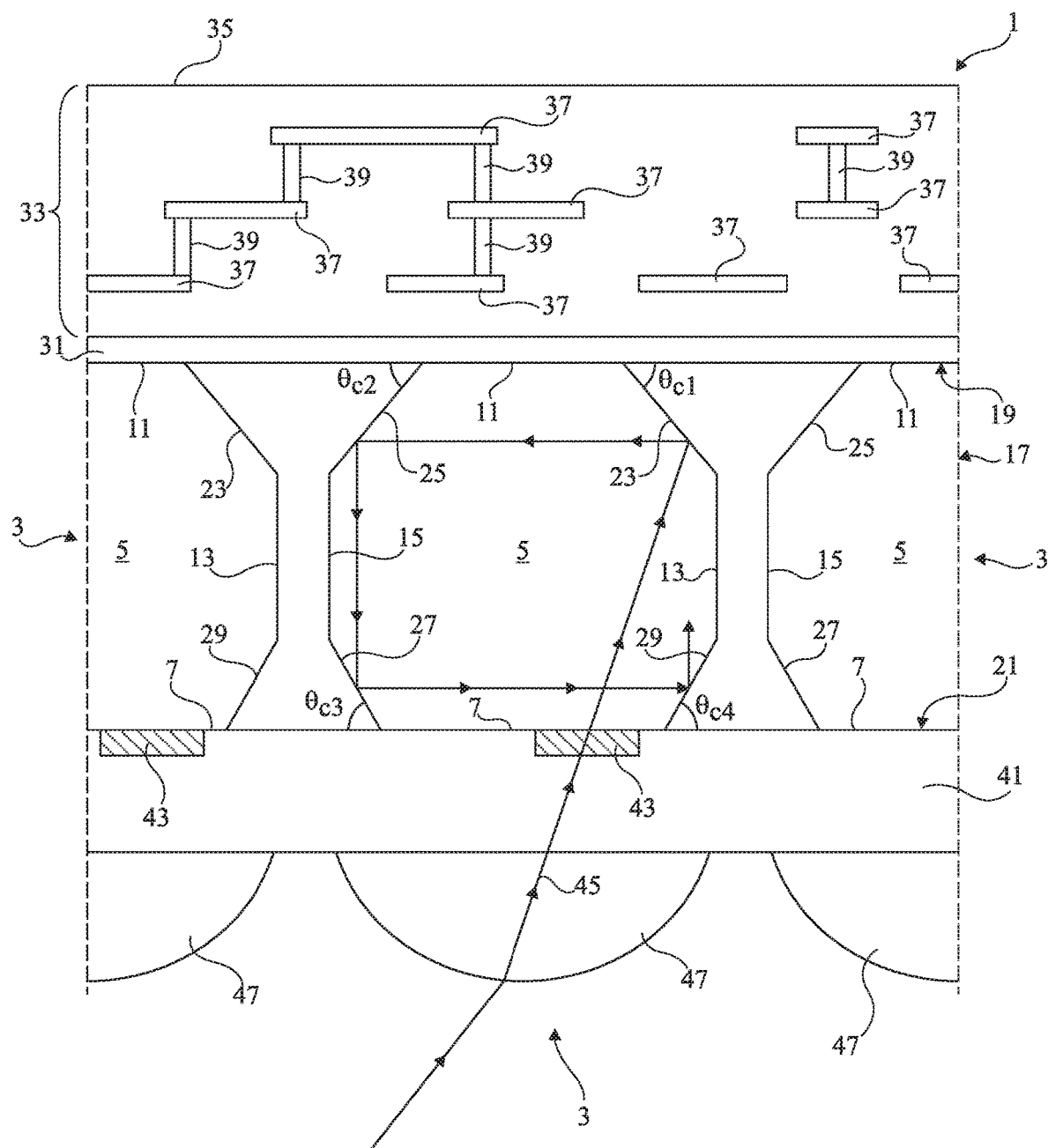
FIG. 1 is a simplified cross-section view of a portion of an image sensor according to an embodiment.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the circuits for reading out the pixels of an image sensor have not been detailed, the described embodiments being compatible with usual pixel readout circuits. Further, the systems and applications where an image sensor may be provided have not been described, the described embodiments being compatible with usual systems and applications where an image sensor may be provided.

Unless otherwise specified, throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred unless otherwise specified to the orientation of the drawings, it being understood that, in practice, the structures shown in the drawings may be oriented differently.

Unless otherwise specified, the terms "about", "approximately", "substantially", and "in the order of" are used herein to designate a tolerance of plus or minus 10%, preferably of plus or minus 5%, of the value in question.

To increase, in near infrared, the portion of the optical power of a ray which is absorbed by a silicon photoconversion region of a pixel, the inventor here provides increasing the optical path of the ray in the photoconversion region of the pixel, which results in an increase in quantum efficiency QE of the pixel.

More particularly, the inventor here provides a pixel where the silicon photoconversion region is surrounded with one or a plurality of materials, preferably dielectric, for example, with a single dielectric material, having a refraction index smaller than that of silicon, for example, a photoconversion region surrounded with silicon oxide. The inventor then provides configuring the interface between the silicon of the photoconversion region and the material(s) surrounding it so that rays reaching the photoconversion region of the pixel are totally reflected on this interface, at least once and, preferably, a plurality of successive times, the rays being then said to be confined in the photoconversion region.

According to an embodiment, the inventor provides for the photoconversion region of the pixel to comprise at least one, for example at least two, preferably at least three, still preferably at least four, oblique surfaces or interfaces coupling together surfaces opposite two by two of the photoconversion region. The pixel, particularly, the oblique surface(s) that it comprises, is preferably configured so that the successive total reflections take place on the oblique surfaces.

FIG. 1 is a simplified cross-section view of a portion of an image sensor 1 according to an embodiment. Sensor 1 is configured to capture the image of a scene in near infrared, that is, to capture light rays emitted by the scene and having wavelengths for example in the range from 700 to 1,000 nm.

The sensor portion shown in FIG. 1 comprises a pixel 3 and a portion only of its two neighboring pixels 3. In practice, sensor 1 may comprise several hundreds, or even several thousands of pixels 3, for example forming an array of pixels 3 where the pixels 3 are arranged in rows and in columns of pixels 3.

Each pixel 3 comprises a silicon photoconversion region 5. The region 5 of each pixel 3 is surrounded with one or a plurality of materials, preferably dielectric, each having a refraction index smaller than that of silicon. In the present example and in the following description, the silicon region 5 of each pixel is surrounded with a single dielectric material, preferably silicon oxide.

Each region 5 extends upwardly (vertically in FIG. 1) from a rear surface 7 intended to receive light to a front surface 11 opposite and parallel to rear surface 7.

According to an embodiment, the region 5 of each pixel 3 extends laterally (horizontally in FIG. 1) in a first direction, for example, contained in the plane of FIG. 1 and parallel to surfaces 7 and 11, between a first lateral surface 13 and a second lateral surface 15 opposite and parallel to first lateral surface 13 and, in a second direction orthogonal to the first direction, for example, a second direction orthogonal to the plane of FIG. 1 and parallel to surfaces 7 and 11, between a third lateral surface and a fourth lateral surface opposite and parallel to the third surface, which third and fourth lateral surfaces are not shown in FIG. 1.

Surfaces 7 and 11 and the lateral surfaces, particularly 13 and 15, correspond to interfaces between the silicon of region 5 and the material of refraction index smaller than that of the silicon which surrounds region 5.

Preferably, pixels 3 are formed in a silicon substrate or wafer 17 extending across the thickness (vertically in FIG. 1) between a first main surface 19 (upper surface in FIG. 1) and a second main surface 21 (lower surface in FIG. 1), opposite and parallel to the first main surface 19. The second main surface 21 is intended to receive light from a scene to be captured. Each region 5 corresponds to a portion of substrate 17. More particularly, for each region 5, the front surface 11 of region 5 then corresponds to a portion of surface 19, the rear surface 7 of region 5 then corresponding to a portion of surface 21.

According to an embodiment, each region 5 further comprises a first oblique surface 23 coupling the first lateral surface 13 of region 5 to the front surface 11 of region 5. The oblique surface 23 corresponds to an interface between the silicon of region 5 and the material having a refraction index smaller than that of the silicon surrounding region 5. Call $\theta_{c1}$ the angle between the plane of surface 11 or 19 and the plane of surface 23. Angle $\theta_{c1}$ is an acute angle, that is, it is smaller than 90°.

According to an embodiment, each region 5 further comprises a second oblique surface 25 coupling the front surface 11 of region 5 to the second lateral surface 15 of region 5. Oblique surface 25 corresponds to an interface between the silicon of region 5 and the material of refraction index smaller than that of the silicon which surrounds region 5. Call $\theta_{c2}$ the acute angle between the plane of surface 25 and the plane of surface 11 or 19.

According to an embodiment, each region 5 further comprises a third oblique surface 27 coupling the second lateral surface 15 of region 5 to the rear surface 7 of region 5. Oblique surface 27 corresponds to an interface between the silicon of region 5 and the material of refraction index smaller than that of the silicon which surrounds region 5. Call $\theta_{c3}$ the acute angle between the plane of surface 7 or 21 and the plane of surface 27.

According to an embodiment, each region 5 further comprises a fourth oblique surface 29 coupling the rear surface 7 of region 5 to the first lateral surface 13 of region 5. Oblique surface 29 corresponds to an interface between the silicon of region 5 and the material of refraction index smaller than that of the silicon which surrounds region 5. Call $\theta_{c4}$ the acute angle between the plane of surface 29 and the plane of surface 7 or 21.

According to an embodiment, a layer 31 of the material having a refraction index smaller than that of silicon entirely covers surface 19 of substrate 17, and thus the front surface 11 of each region 5. Preferably, a surface of layer 31 is in contact with the entire surface 19 of substrate 17.

According to an embodiment, an interconnection structure 33 rests on surface 19 of substrate 17, for example, on top of and in contact with layer 31 when layer 31 is considered as not belonging to structure 33, or on top of and in contact with surface 19 when layer 31 is considered as belonging to interconnection structure 33.

Structure 33 is configured to electrically couple components, for example, transistors, for example of circuits for reading out pixels 3, formed inside and/or on top of substrate 17 on the side of its surface 19, together and/or to connection pads (not shown) arranged at the level of a surface 35 of structure 33 opposite to surface 19. Structure 33 for example comprises portions of conductive layers 37 separated from one another by insulating layers, not detailed, for example, insulating layers made of silicon oxide and/or of silicon nitride, the portions of conductive layers 37 being coupled to one another, to the components, and/or to the electric connection pads by electrically-conductive vias 39.

According to an embodiment, a layer 41 of the material having a refraction index greater than that of silicon rests on surface 21 of substrate 17.

In the embodiment illustrated in FIG. 1, each pixel 3 comprises an antireflection layer or layer portion 43, for example, made of silicon nitride when layer 41 is made of silicon oxide. The antireflection layer 43 of each pixel 3 rests on top of and in contact with the rear surface 7 of region 5 of pixel 3. Preferably, layer 43 is arranged to be crossed by light rays which will be totally reflected on surface 23, a single one of these rays, bearing reference numeral 45, being shown in FIG. 1. Preferably, layer 43 only covers a portion of surface 7 of region 5, the rest of surface 7 of region 5, and more generally the rest of surface 21 which is not covered with layers 43, then being covered with the layer 41 with which surface 21 is in contact. Layer 41 covers, on the side of surface 21 of substrate 17, layers 43. In other words, the thickness of layer 41 is greater than that of the layers 43 of pixels 3.

In another embodiment, not shown, layers 43 may be omitted, the entire surface 21 being then covered with layer 41 and being in contact with layer 41.

According to an embodiment, each pixel 3 comprises a lens or microlens 47. The microlens 47 of a given pixel 3 is then configured to focus, in region 5 of pixel 3, the incident light rays of pixel 3, that is, the light rays reaching microlens 47 of pixel 3. In the case where pixel 3 is provided with an antireflection layer 43, microlens 47 is preferably configured so that substantially all the rays focused by microlens 47 in region 5 of pixel 3, or even all the rays focused by microlens 47 in region 5 of pixel 3, cross the antireflection layer 43 of the pixel.

Preferably, the microlens 47 of a given pixel 3 is configured to focus the incident light rays of pixel 3 on or towards the first oblique surface 23 of region 5 of pixel 3, so that all or part of these light rays are totally reflected thereon.

In particular, the microlens 47 of a given pixel 3 is preferably configured so that the light rays focused on or towards the surface 23 of region 5 of pixel 3 propagate along a direction forming a non-zero angle with respect to a normal to the rear surface 7 of region 5 of pixel 3.

Preferably, a light ray totally reflected on interface 23, for example, the ray 45 shown in FIG. 1, corresponds to the chief ray of pixel 3. Preferably, although this is not shown in FIG. 1, the chief ray 45 comes out of the microlens 47 of the pixel at the level of the optical axis of microlens 47. All the incident rays of pixel 3 that microlens 47 is capable of focusing into region 5 for example form a cone around the chief ray 45, the base of the cone corresponding to the surface of microlens 47 through which the rays come out, and the top of the cone being crossed by the chief ray 45.

As an example, so that the microlens 47 of a pixel 3 focuses the incident rays of pixel 3 towards or onto interface 23 of the pixel, the optical axis of microlens 47, that is, for example, its axis of symmetry, is offset with respect to the central axis of pixel 3, that is, the axis orthogonal to surface 7 of pixel 3 which crosses the center of pixel 3, which offset is not shown in FIG. 1. In other words, the central axis of pixel 3 is for example parallel to the lateral surfaces of region 5 of pixel 3, and is located at a same distance from the first and second lateral surfaces 13 and 15 of the pixel, on the one hand, and at a same distance from the third and fourth lateral surfaces of the pixel, on the other hand. The offset between the microlens 47 of a pixel 3 and the central axis of the pixel is for example provided for all the pixels 3 of the sensor except for the pixel(s) arranged at the center of the sensor, for which the light rays, particularly the chief rays of these pixels, reach the pixel with a normal incidence relative to surface 21 of the sensor. It will be within the abilities of those skilled in the art to determine, for a given pixel 3, the offset between the optical axis of the microlens 47 of pixel 3 and the central axis of pixel 3 to obtain the above-described focusing conditions, particularly by using simulation software designated with trade name Lumerical. Further, in the pixel(s) arranged at the center of the sensor, so that the incident rays of each of the central pixels can reach interfaces 23 and 25, a diffraction grating may be arranged on the path of the incident rays, before they reach the areas 5 of these pixels. As an example, the pitch of the gratings is then determined so that the rays diffracted by the gratings reach interfaces 23 and 25.

As an example, the incident rays of a pixel 3 originate from or come out of an optical objective of sensor 1, for example, a lens of this optical objective. The objective is common to all the pixels 3 and is arranged above (under in FIG. 1) surface 21 of substrate 17. As an example, for each pixel 3, the chief ray of pixel 3 comes out of the objective of the sensor at the level of the optical axis of the objective, and all the rays that the objective is capable of focusing onto and/or into the microlens 47 of pixel 3 for example form a cone around the chief ray. The base of the cone then corresponds to the output surface of the objective, and the top of the cone is crossed by the chief ray.

As can be understood from the above description, surface 23 is configured so that at least one ray, for example, at least the chief ray of the pixel, is totally reflected on interface 23.

According to an embodiment, oblique surface 25 is configured so that at least one ray, for example, at least the chief ray of the pixel, is totally reflected at the level of interface 25 after having been totally reflected on interface 23.

According to an embodiment, oblique surface 27 is configured so that at least one ray, for example, at least the chief ray of the pixel, is totally reflected at the level of interface 27 after having been totally reflected on interface 25.

According to an embodiment, oblique surface 29 is configured so that at least one ray, for example, at least the chief ray of the pixel, is totally reflected at the level of interface 29 after having been totally reflected on interface 27. Preferably, interface 29 is further configured so that, after a total reflection on interface 29, the ray is propagated towards interface 23 to be submitted to a new total reflection thereon.

It will be within the abilities of those skilled in the art to determine angle $\theta_{c1}$ and, according to the considered embodiment, also angle $\theta_{c2}$, angle $\theta_{c3}$, and angle $\theta_{c4}$, to obtain the above-described operation. Particularly, it will be within the abilities of those skilled in the art to determine this or these angle(s) by using a calculation table establishing a relationship between the conditions of total reflection on the considered interfaces 23, 25, 27, and 29, the respective angles $\theta_{c1}$, $\theta_{c2}$, $\theta_{c3}$, and $\theta_{c4}$, the dimensions of region 5, and the angles of incidence of the rays on the respective interfaces 23, 25, 27, and 29. Those skilled in the art may for example validate the angle(s) thus determined by means of a computer-assisted simulation tool such as tool designated with trade name Lumerical.

According to a specific embodiment, each angle $\theta_{c1}$, $\theta_{c2}$, $\theta_{c3}$, $\theta_{c4}$ is substantially equal to 55°, for example, equal to 55°.

To increase the quantum efficiency of the pixels of a sensor in near infrared, it could have been devised to provide each pixel of the sensor with reflective metal plates arranged in the sensor interconnection structure. The rays reaching the rear surface of a pixel would then have crossed the photoconversion region of the pixel in a first direction, they would have been reflected by the reflective plates, and would have crossed the photoconversion region in a second direction opposite to the first one before coming out of the photoconversion region through its rear surface.

However, the rays which would have come out of the photoconversion region through its rear surface, after reflection on the metal plates, might have reached neighboring pixels, particularly after uncontrolled reflections on the microlens of the pixel and/on the optical objective of the sensor. This would have resulted in artifacts in the image obtained by means of the sensor. For example, the inventor has observed that with such a sensor provided with metal plates, for a ray reaching the rear surface of the pixel with a given initial optical power, the percentage of the initial optical power which is absorbed by the silicon of the photoconversion region of the pixel is at least twice as low as the percentage of initial optical power which comes out of the rear surface of the photoconversion area. Further, the percentage of initial optical power which comes out of the rear surface of the photoconversion region is significant, for example, greater than 30% for a photoconversion region having a thickness equal to 3 μm and having a rear surface with a surface area of 2 μm*2 μm.

To increase the quantum efficiency of the pixels of a sensor, it could also have been devised to provide each pixel of the sensor with a diffraction grating arranged at the level of the rear surface of the pixel while omitting interfaces 23, 25, 27, and 29. The diffracted rays would then have obliquely propagated in the photoconversion region of each pixel, which would have increased the optical path of the rays in the silicon of the photoconversion region of each pixel. However, at least certain diffracted rays might then have crossed the insulating structures which separate the photoconversion regions of the pixels from one another, and might thus have reached photoconversion regions of neighboring pixels. This would here again have resulted in artifacts in the image obtained by means of the sensor. Further, a disadvantage of such a structure is that a significant portion of the optical power of the light rays reaching pixel 3 comes out of the rear surface of the pixel photoconversion region.

In a pixel 3, for at least one incident ray of the pixel, for example, the chief ray of the pixel, the optical path in the silicon region 5 of the pixel is increased by means of a total reflection on interface 23, preferably followed by a total reflection on interface 25, more preferably still followed by a total reflection on interface 27, and even more preferably still followed by a total reflection on interface 29. In practice, although FIG. 1 illustrates a single ray 45 corresponding to the chief ray of pixel 3, other incident rays of the pixels, for example, rays contained in the cone of rays centered on the chief ray and focused on interface 23 of pixel 3, are also totally reflected on this oblique interface and, possibly, successively on interface 25, or even also on interface 27, or even also on interface 29.

In such a pixel 3, for a ray reaching the rear surface 7 of the pixel with a given initial optical power, the percentage of the initial optical power which is absorbed by the silicon of photoconversion region 5 is more significant than in a pixel provided with reflective metal plates such as described hereabove. For example, approximately 20% of the initial optical power is absorbed for a photoconversion region 5 having a thickness equal to 3 μm, and having a rear surface area of 2 μm*2 μm.

Further, in such a pixel 3, for a ray reaching the rear surface 7 of a pixel with a given initial optical power, the percentage of the initial optical power which is absorbed by the silicon of photoconversion region 5 is substantially equal to, or even smaller than, the percentage of the initial optical power which may come out of rear surface 7. Thus, the percentage of the initial optical power which may come out of the rear surface of a pixel 3 is smaller than the percentage of the initial optical power which comes out of the rear surface of a pixel provided with reflective plates such as described hereabove. In other words, pixel 3 provides a better confinement of the light rays in the photoconversion region of pixel 3.

Further, in pixel 3, the total reflections are controlled, which enables to limit, or even to suppress, the possibility for a light ray reaching the region 5 of a pixel to propagate all the way to the region 5 of a neighboring pixel 3, conversely to what occurs in pixels such as described hereabove, which are each provided with a diffraction grating, but do not comprise interfaces 23, 25, 27, and 29.

Thus, as compared with a sensor comprising a plurality of pixels provided with reflective metal plates and/or with diffraction gratings such as described hereabove, a sensor comprising a plurality of pixels 3 enables to obtain an image where artifacts are decreased, or even suppressed.

The advantages provided by a pixel 3 are all the greater as the incident rays of pixel 3 remain confined within the photoconversion region 5 of the pixel or, in other words, as the number of total reflections at the interface between region 5 and the material which surrounds it is high.

Figure 2:
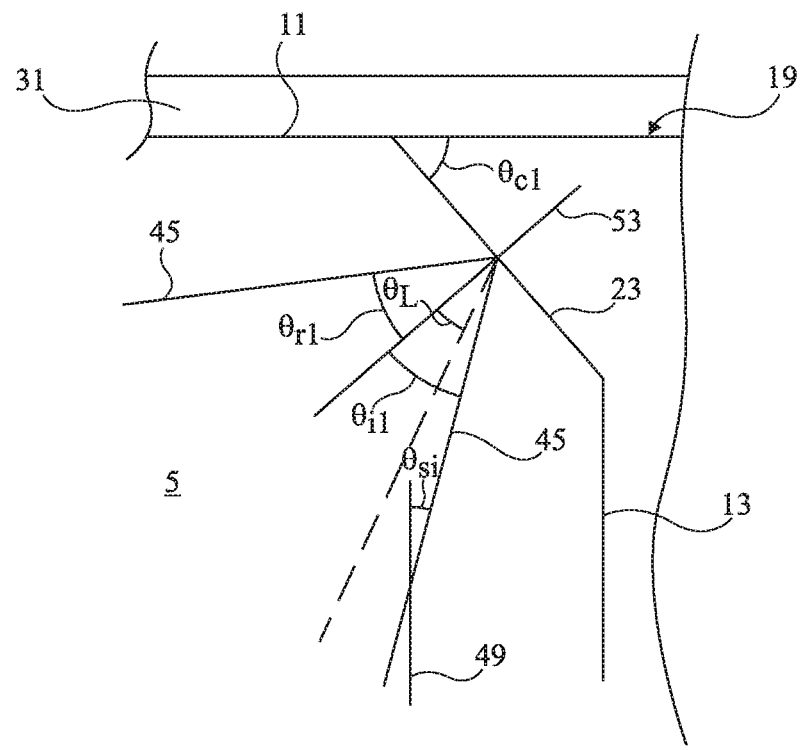
FIG. 2 is an enlarged simplified cross-section view of a portion of a pixel of the sensor of FIG. 1.

FIG. 2 is an enlarged simplified cross-section view of a portion of a pixel 3 of the sensor of FIG. 1 and particularly of a portion comprising oblique interface 23. The conditions of total reflection of an incident light ray of pixel 3, in this example the chief ray 45 of pixel 3, on interface 23 will be detailed in relation with FIG. 2.

It is here considered as an example that chief ray 45 reaches the rear surface 7 (not shown) of region 5 with an acute angle of incidence $\theta_{si}$ measured with respect to the normal 49 to rear surface 7.

To obtain a total reflection of ray 45 on interface 23, the acute angle of incidence $\theta_{i1}$ of ray 45 on interface 23, measured with respect to the normal 51 to interface 23, verifies the following relation (1):

$$\theta_{i1} > \sin^{-1}(n_2/n_1),$$

$n_1$ and $n_2$ being the refraction indexes, at the considered wavelength, respectively of the silicon of region 5 and of the material which surrounds region 5, for example, the refraction index $n_2$ of silicon oxide.

The above relation (1) originates from the Snell-Descartes laws, well known by those skilled in the art.

In other words, angle $\theta_{i1}$ verifies the following relation (2):

$$\theta_{i1} > \theta_L,$$

$\theta_L$ being the limiting total reflection angle defined by the following relation (3):

$$\theta_L = \sin^{-1}(n_2/n_1).$$

Call $\theta_{r1}$ the acute angle of the ray 45 reflected on interface 23 and measured with respect to the normal 53 to interface 23. In practice, angle $\theta_{r1}$ is equal to angle $\theta_{i1}$.

Due to the fact that angle $\theta_{i1}$ should be greater than angle $\theta_L$ to obtain a total reflection of ray 45 on interface 23, this implies that angle $\theta_{c1}$ is also greater than limiting angle $\theta_L$. In other words, angle $\theta_{c1}$ verifies the following relation (4):

$$\theta_{c1} > \theta_L.$$

As an example, for a ray 45 having a wavelength equal to 850 nm, respectively 940 nm, angle $\theta_{c1}$ verifies relation (4) if it is greater than or equal to 23.4°, respectively to 23.8°, when $n_2$ is the optical index of silicon oxide and $n_1$ is the optical index of silicon.

Preferably, interface 23 is further configured so that angle $\theta_{r1}$ is smaller than or equal to, preferably equal to, 90° minus the value of angle $\theta_{c1}$, so that the ray 45 reflected on interface 23 propagates all the way to interface 25 (not shown in FIG. 1) substantially parallel, preferably parallel, to surface 11 or 21, without reaching surface 11 or 21. This implies that, preferably, angle $\theta_{c1}$ is smaller than 90° minus the value of limiting angle $\theta_L$, or, in others words, angle $\theta_{c1}$ verifies the following relation (5):

$$\theta_{c1} > 90° - \theta_L.$$

As an example, for a ray 45 having a wavelength equal to 850 nm, respectively 940 nm, angle $\theta_{C1}$ verifies relation (5) if it is smaller than or equal to 66.6°, respectively to 66.2°, when $n_2$ is the optical index of silicon oxide and $n_1$ is the optical index of silicon.

Further, angle $\theta_{C1}$ verifies the following relation (6):

$$\theta_{c1} = \theta_{i1} + \theta_{si}.$$

This implies that, if angle $\theta_{c1}$ verifies relations (5) and (6), and if angle $\theta_{i1}$ verifies relation (2), then angle $\theta_{si}$ should verify the following relation (7):

$$\theta_{si} < 90° - 2*\theta_L$$

As an example, for a ray 45 having a wavelength equal to 850 nm, respectively 940 nm, angle $\theta_{si}$ verifies relation (7) if it is smaller than or equal to 43.2°, respectively to 42.4°, when $n_2$ is the optical index of silicon oxide and $n_1$ is the optical index of silicon.

In practice, due to the fact that the pixels 3 of sensor 1 are provided with microlenses 47, and due to the angle change undergone by a light ray as it enters silicon photoconversion region 5, even considering large angles of incidence originating from the sensor lens or objective, angle $\theta_{si}$ always respects the above relation (7).

As an example, before reaching the microlens of a pixel 3, a light ray propagating with an acute angle of 20°, respectively 40°, measured with respect to the normal to surface 21 of substrate 17 (FIG. 1), results in a light ray reaching surface 7 of pixel 3 with an angle $\theta_{si}$ equal to 5.5°, respectively to 10.3°.

Although conditions of total reflection on interface 23 have been described for angle $\theta_{c1}$ and preferred conditions of total reflection of an incident ray on this interface have been described for angle $\theta_{c1}$ and for angle $\theta_{si}$, it will be within the abilities of those skilled in the art to determine similar conditions for angles $\theta_{c2}$, $\theta_{c3}$, and $\theta_{c4}$ of the respective interfaces 25, 27, and 29, and for the angles of incidence of the rays on these respective surfaces. In particular, to obtain successive total reflections on interfaces 25, 27, and 29, each of angles $\theta_{c2}$, $\theta_{c3}$, and $\theta_{c4}$ verifies relation (1) and is greater than angle $\theta_L$.

Further, as already previously mentioned, although FIG. 2 illustrates a single ray 45 corresponding to the chief ray of pixel 3, other incident rays of the pixel are also totally reflected on interface 23 and, possibly successively on interface 25, or even also on interface 27, or even also on interface 29.

Figure 3:
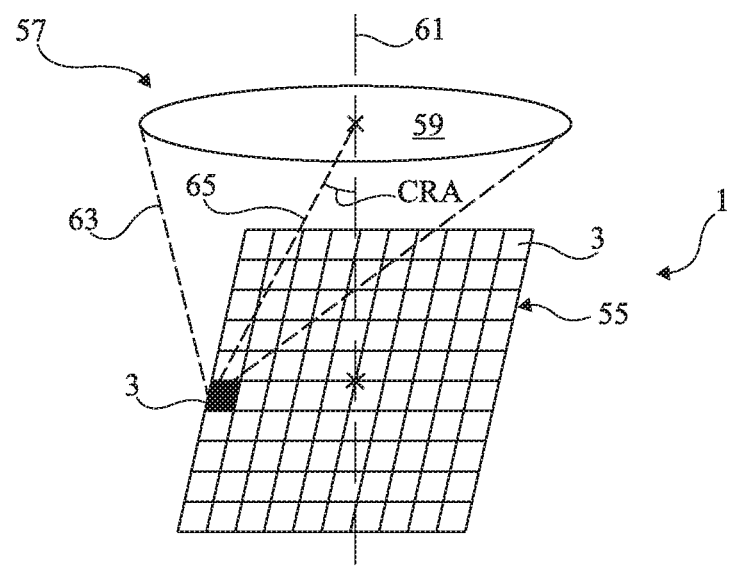
FIG. 3 is a very simplified partial perspective view of the sensor of FIG. 1.

FIG. 3 is a very simplified partial perspective view of the sensor 1 of FIG. 1, illustrating the chief ray 65 of a pixel 3 (in black in the drawing) of sensor 1.

In FIG. 3, each pixel 3 of sensor 1 is very schematically shown as a square representing the upper surface of pixel 3, that is, the surface area occupied by pixel 3 at the level of the surface 21 of substrate 17 (FIG. 1).

Pixels 3 are here arranged in the form of an array 55 of pixels 3, comprising a plurality of columns of pixels 3 and a plurality of rows of pixels 3, that is, ten rows and ten columns in the example of FIG. 3.

Sensor 1 further comprises an objective 57. Objective 57 comprises a plurality of lenses, diaphragms, and/or pupils, not detailed in FIG. 3. Objective 57 is configured to focus all the light rays emitted by a point of a scene to be captured which reach objective 57, towards a corresponding pixel 3.

FIG. 3 shows as a disk 59 the output surface area of objective 57, which for example corresponds to the surface area of an output lens of the objective, surface 59 facing array 55.

Output surface 59 of objective 57 and array 55 of pixels 3 of sensor 1 are preferably centered on a same axis 61, corresponding to the optical axis of sensor 1.

In operation, all the light rays originating from a point of a scene to be captured which reach objective 57 are focused towards a corresponding pixel 3. The chief ray 65 of pixel 3 then corresponds to the ray crossing the center, or optical axis, 61 of objective 57 and traveling all the way to this pixel 3. The chief ray is different for each point of the scene to be captured, and thus for each pixel of the sensor.

Thus, at the output of objective 57, for a given point of the scene to be captured, all the light rays originating from this point are distributed in a cone 63 having its top located at the level of the pixel 3 corresponding to this point, and having its base corresponding to the output surface 59 of objective 57. Cone 63 is substantially centered around the chief ray 65 of the pixel, chief ray 65 coming out of objective 57 at the level of optical axis 61 and crossing pixel 3.

Preferably, for a given pixel 3, the ray 45 shown in FIGS. 1 and 2 corresponds to the chief ray 65 shown in FIG. 3.

As previously indicated in relation with FIG. 1, it is provided to offset the microlenses 47 of pixels 3, in particular of the pixels 3 which are not located at the center of array 55 of the sensor, so that the chief ray 65, shown in FIG. 3 for a given pixel, reaches surface 23 of pixel 3 (FIG. 1) with a non-zero angle of incidence $\theta_{si}$ (FIG. 2) on surface 7 and while respecting condition (7), and that chief ray 65 is totally reflected on interface 23.

In other words, in the pixels 3 having their microlenses offset so that the rays 65 of these pixels reach the surfaces 23 of these pixels, microlenses 47 have a radial offset relative to the optical axis 61 of sensor 1 such that, for each of pixels 3, the chief ray 65 of the pixel is focused onto surface 23 (FIG. 1) of pixel 3. It should be noted that, for a given pixel 3, the chief ray 65 of the pixel propagates in a direction forming an angle CRA with axis 61, angle CRA being called chief ray angle.

It will be within the abilities of those skilled in the art to determine, for each pixel 3, the offset of the microlens 47 of pixel 3 with respect to the central axis of pixel 3. Indeed, in usual image sensors, offsets of the microlenses are already provided, but to focus the incident rays reaching the microlens of each pixel towards the center of the photoconversion region of the pixel, rather than towards surface 23 as provided herein.

Further, as previously described, for each central pixel 3 of sensor 1 for which no offset is usually provided between the microlens 47 of pixel 3 and the pixel axis, a diffraction grating may be provided so that the incident rays of the pixel are deviated towards surfaces 23 and 25.

An embodiment of a method of manufacturing a sensor 1 such as described in relation with FIG. 1 will now be described in relation with FIGS. 4 to 8, which drawings each show, by a simplified cross-section view taken in a same cross-section plane, a structure at successive steps of the method.

Figure 4:
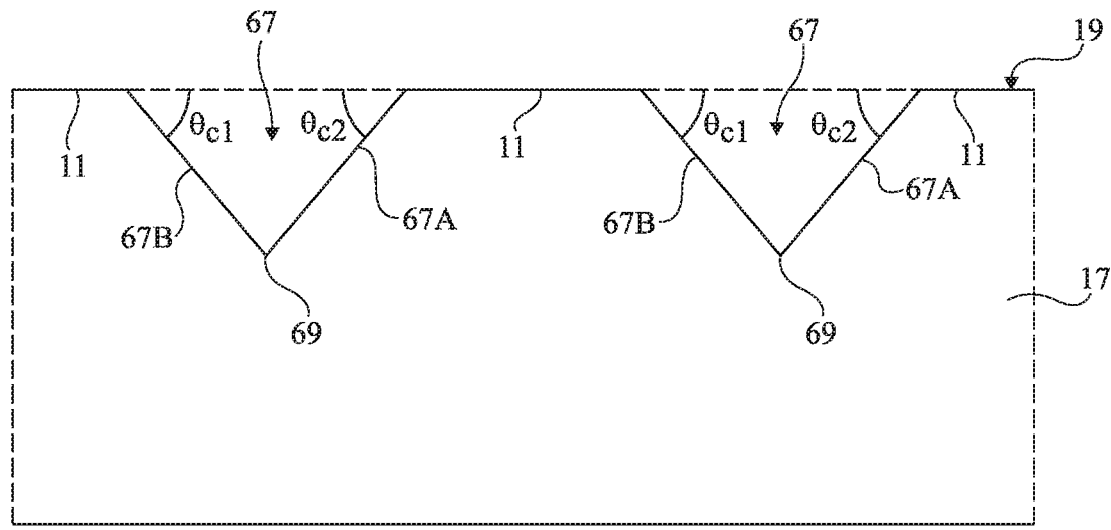
FIG. 4 is a simplified cross-section view of a structure at a step of an implementation mode of a method of manufacturing the sensor of FIG. 1.

At the step illustrated in FIG. 4, first trenches 67 have been etched on the side of or from the surface 19 of silicon substrate 17. Each trench 67 has opposite walls 67A and 67B, respectively on the right-hand side and on the left-hand side in FIG. 4, which are oblique and meet at the bottom 69 of trench 67. The angle between walls 67A, respectively 67B, and the plane of surface 19 corresponds to angle $\theta_{c2}$, respectively $\theta_{c1}$, the plane of surface 19 being shown in dotted lines above trenches 67. In other words, the walls 67B of trenches 67 correspond to oblique surfaces 23 (FIG. 1), the walls 67A corresponding to oblique surfaces 25 (FIG. 1). Thus, between two neighboring or adjacent trenches 67, the portion of surface 19 which is not etched corresponds to the surface 11 of a region 5.

Although this is not shown in FIG. 4, trenches 67 are etched from openings formed in an etch mask formed on surface 19, for example, a resin mask or a silicon oxide mask called hard mask.

As an example, trenches 67 are etched by wet etching by means of an etchant comprising potassium hydroxide (KOH), tetraethylamonium hydroxide (TEAH), or tetramethylamonium hydroxide (TMEA).

As an example, the etching is performed by following the angle between two crystalline orientations of silicon, for example, the angle between crystal planes of respective orientations (111) and (100), which angle is equal to 55°. Angles $\theta_{c1}$ and $\theta_{c2}$ are then equal to each other and to the angle between these crystal planes or crystal orientations of silicon. It should be noted that, advantageously, such a 55° angle is greater than angle $\theta_L$ for a silicon/silicon oxide interface and light rays in near infrared.

Figure 5:
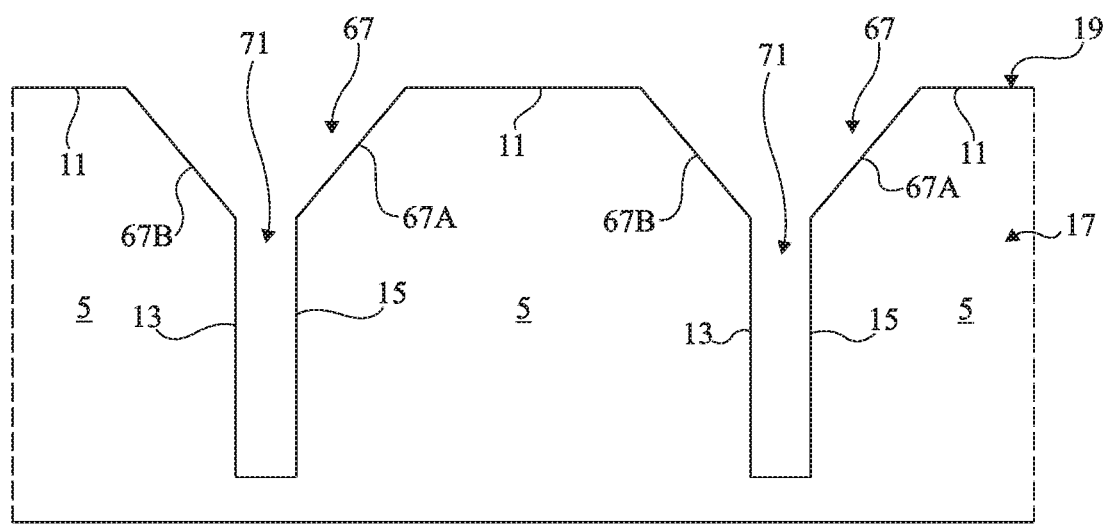
FIG. 5 is a simplified cross-section view of the structure of FIG. 4 at a next step of the manufacturing method.

At the step illustrated in FIG. 5, second trenches 71 have been etched on the side of surface 19 of silicon substrate 17. Conversely to trenches 67, trenches 71 are vertical trenches. Trenches 71 penetrate vertically into substrate 17, across all or part of the thickness thereof. The trenches laterally delimit the photoconversion regions 5 of the pixels 3 of sensor 1. In other words, the lateral walls of a trench 71 for example correspond to the first lateral surface 13 of a pixel 3 and to the second lateral surface 15 of a neighboring pixels when trench 71 is parallel to trenches 67, and for example, to the third lateral surface of a pixel 3 and the fourth lateral surface of a neighboring pixel 3 when trench 71 is orthogonal to trenches 67, which last case is not shown in FIG. 5.

For each trench 67, a trench 71 is etched to penetrate into substrate 17 from the bottom of trench 67. In other words, the bottom 69 (FIG. 4) of each trench 67 is crossed by a corresponding trench 71, trenches 67 and 71 then being aligned. Still in other words, a trench 71 is etched from the bottom 69 of each trench 67.

Although this is not shown in FIG. 5, trenches 71 are etched from openings formed in an etch mask formed on surface 19 and a portion of walls 67A and 67B, for example, a resin mask or a silicon oxide mask called hard mask. In particular, when a trench 71 is etched to cross the bottom 9 of a trench 67, the opening of the mask from which trench 71 is etched emerges onto bottom 69 of trench 67.

Figure 6:
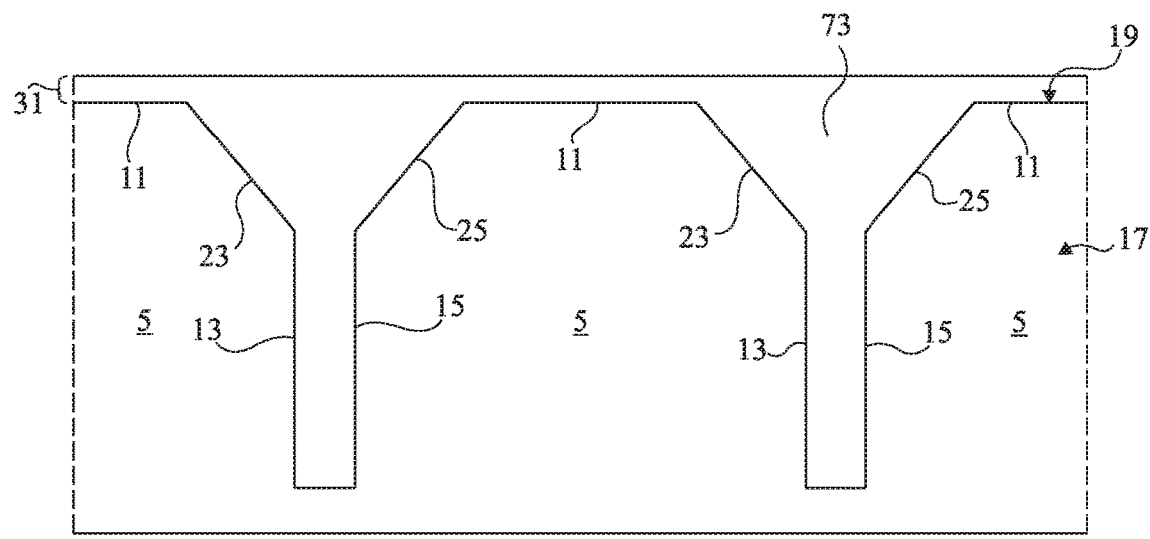
FIG. 6 is a simplified cross-section view of the structure of FIG. 5 at a next step of the manufacturing method.

At the step illustrated in FIG. 6, a layer 73 of the material having refraction index $n_2$, for example, a silicon oxide layer 73, is deposited to fill trenches 67, trenches 71, and to cover surface 19 of substrate 17. Layer 73 then covers the front surface 11 of the photoconversion regions 5 of pixels 3.

In this embodiment, after a possible step of leveling the exposed surface of layer 73, for example, by chemical mechanical polishing CMP, the portion of layer 73 arranged above the level of surface 19 forms the layer 31 described in relation with FIG. 1.

In an alternative embodiment, not shown, layer 31 is deposited after the removal, for example, by CMP, of the portion of layer 73 arranged above the level of surface 19.

Figure 7:
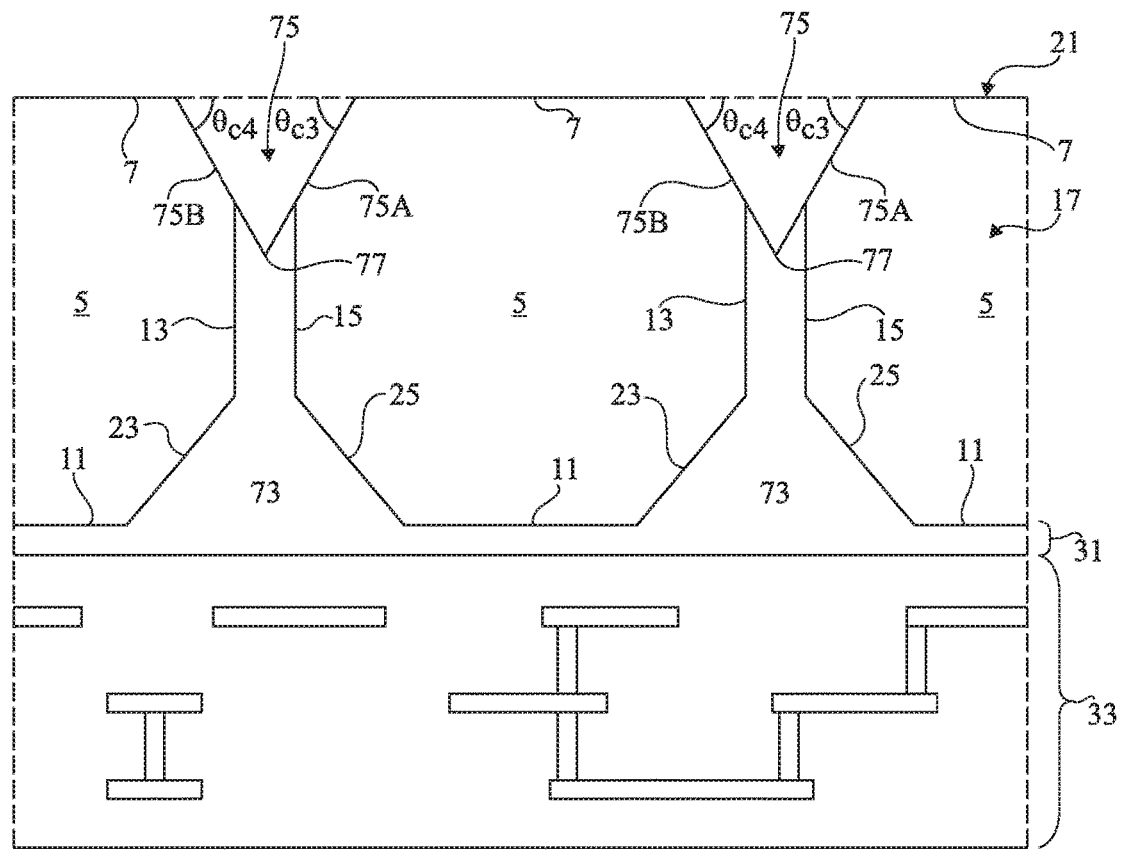
FIG. 7 is a simplified cross-section view of the structure of FIG. 6 at a next step of the manufacturing method.

At the step illustrated in FIG. 7, interconnection structure 33 has been formed on layer 31, by successive steps of deposition and etching of metal layers and of insulating layers, after which the obtained structure has been flipped, as shown in FIG. 7.

According to the thickness of substrate 17 and to the thickness targeted for regions 5, a step of thinning substrate 17 may be provided, substrate 17 then being thinned on the side of its surface 21.

Still at the step illustrated in FIG. 7, third trenches 75 are then etched from, or on the side of, substrate 21 of substrate 17. Each trench 75 is arranged opposite a corresponding trench 67 (FIG. 4), with which it is aligned. Like trenches 67, each trench 75 has opposite lateral walls 75A and 75B, respectively on the right-hand side and on the left-hand side of FIG. 7, which are oblique and which meet at the bottom 77 of trench 75. The bottom 77 of each trench 75 is arranged in the material of refraction index $n_2$ filling a corresponding trench 71. The angle between walls 75A, respectively 75B, and the plane of surface 21 corresponds to angle $\theta_{c3}$, respectively $\theta_{c4}$, the plane of surface 21 being shown in dotted lines above trenches 75. In other words, the walls 75A of trenches 75 correspond to oblique surfaces 27, walls 75B corresponding to oblique surfaces 29. Thus, between two neighboring or adjacent trenches 75, the portion of surface 21 which is not etched corresponds to the surface 7 of a region 5.

Although this is not shown in FIG. 7, trenches 75 are etched from openings formed in an etch mask formed on surface 21, for example, a resin mask or a silicon oxide mask called hard mask.

As an example, trenches 67 are etched by wet etching by means of an etchant comprising potassium hydroxide (KOH), tetraethylamonium hydroxide (TEAH), or tetramethylamonium hydroxide (TMEA).

As an example, the etching is performed by following the angle between two crystal orientations of silicon, for example, the angle between crystal planes of respective orientations (111) and (100), which angle is equal to 55°. Angles $\theta_{c3}$ and $\theta_{c4}$ are then equal to each other and to the angle between these crystal planes or crystal orientations of silicon. It should be noted that, advantageously, such a 55° angle is greater than angle $\theta_L$ for a silicon/silicon oxide interface and light rays in near infrared.

Figure 8:
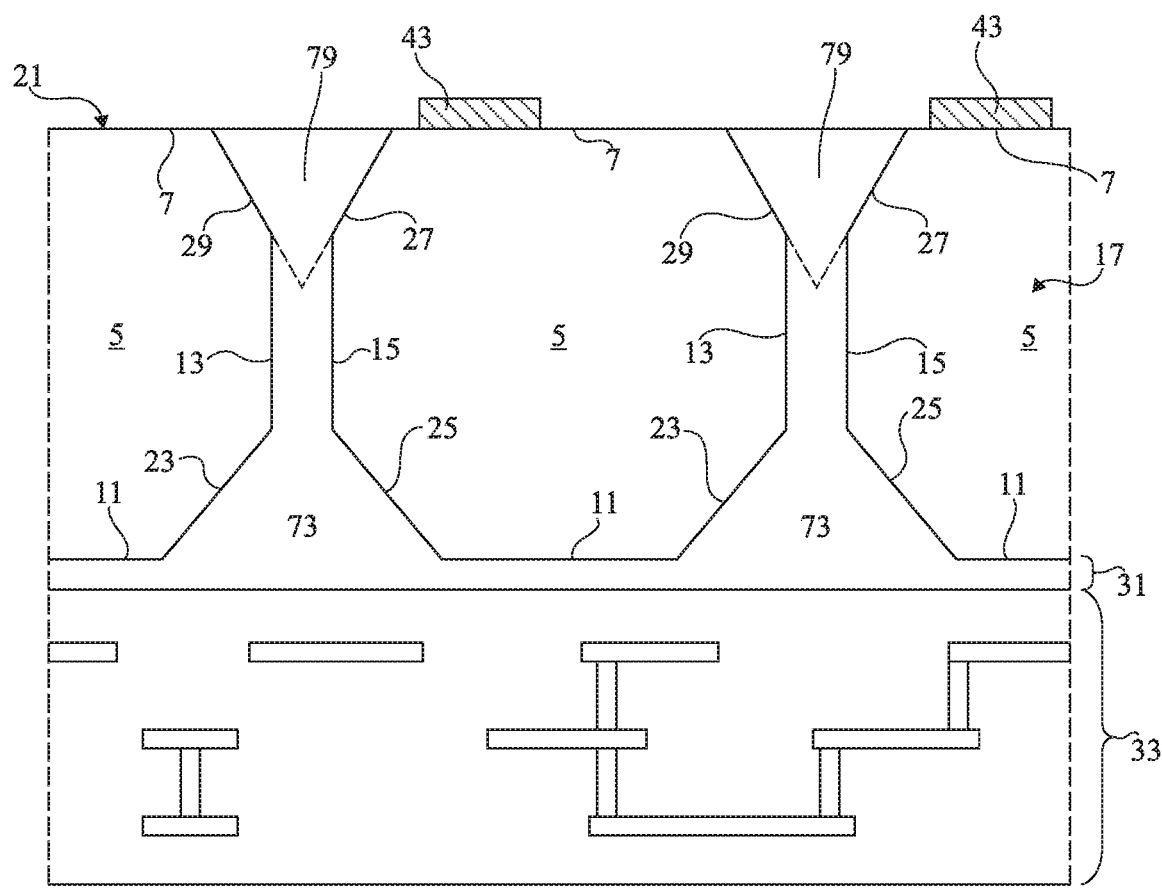
FIG. 8 is a simplified cross-section view of the structure of FIG. 7 at a next step of the manufacturing method.

At the step illustrated in FIG. 8, a layer 79 of the material of refraction index $n_2$, for example a silicon oxide layer, is deposited on the side of surface 21 of substrate 17 to fill trenches 75, the limit between layers 79 and 73 being shown in dotted lines in FIG. 8.

According to an embodiment, the exposed surface of layer 79 is then leveled, for example, by CMP, all the way to surface 21 of substrate 17. In other words, layer 79 is only left in place in trenches 75. Optionally, antireflection layer portions 43 are then formed on top of and in contact with the rear surfaces 7 of regions 5, each portion of antireflection layer 43 preferably only covering a portion of the corresponding surface 7.

As an example, antireflection layer portions 43 are obtained by depositing a layer over the entire exposed surface of the structure on the side of the surface 21 of substrate 17 (full plate deposition) and then by removing by etching portions of this layer while leaving in place antireflection layer portions 43. As an example, antireflection layer portions 43 are made of silicon nitride.

At a next step, not illustrated, layer 41 of the material of index $n_2$ is then deposited over the entire exposed surface of the structure, on the side of surface 21 of substrate 17 (full plate deposition) and microlenses 47 are then formed on layer 41 to obtain the structure of FIG. 1.

According to an alternative embodiment, not shown, where the portions of antireflection layer 43 are omitted, layer 79 is deposited with a thickness greater than that of layer 41, after which its exposed surface is leveled, for example, by CMP, so that the portion of layer 79 left in place above the level of surface 21 of substrate 17 corresponds to layer 41. Similarly to what has been described hereabove, the microlenses 47 of pixels 3 are then formed on layer 41, that is, in this variation, on the exposed and leveled surface of layer 79.

Although pixels 3 where the lateral opposite surfaces of the region 5 of each pixel 3 are parallel to one another have been described, the surfaces may not be exactly parallel to one another, particularly according to the implemented etching of trenches 71.

Further, although microlenses 47 symmetrical with respect to their optical axes have been described, it will be within the abilities of those skilled in the art to provide asymmetrical microlenses, for example, formed by micro- or nanoprinting, or by grayscale lithography, to focus incident rays of pixels 3 onto their oblique surfaces 23.

Although this has been neither illustrated, nor detailed, the first and second lateral surfaces 13 and 15 of a pixel 3 of sensor 1 may be oriented differently according to the considered pixel 3. For example, the first and second lateral surfaces 13 and 15 of a first pixel 3 of sensor 1, for example, a pixel 3 arranged towards an edge of pixel array 55, in a substantially central row of array 55, may be substantially orthogonal to the first and second lateral surfaces 13 and 15 of a second pixel 3, for example, a pixel 3 arranged towards an edge of array 55 of pixels 3, in a substantially central column of array 55. Further, it may be provided for at least certain pixels 3 of sensor 1 to comprise one or a plurality of oblique surfaces between the third lateral surface of the pixel, the front surface of the pixel, the fourth lateral surface of the pixel, and the rear surface of the pixel, the oblique surface(s) being similar to the respective oblique surfaces 23, 25, 27, and 29. In other words, a given pixel 3 may comprise from 1 to 8 oblique interfaces. In particular, according to an embodiment, it is provided for the central pixels of the sensor to comprise 8 oblique interfaces.

Further, although embodiments and variations where area 5 is made of silicon and is surrounded with silicon oxide have been described, it will be within the abilities of those skilled in the art to adapt such embodiments and variations to the case where silicon oxide is replaced with one or a plurality of other dielectric materials, for example, with a gas such as air.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor, comprising:
a plurality of pixels, each of the pixels including:
a silicon photoconversion region, the photoconversion region of each pixel extends upwardly from a rear surface to a front surface opposite to the rear surface and extends laterally between four lateral surfaces, the rear surface configured to receive at least one ray, the photoconversion region including:
a first oblique surface coupling a first one of the four lateral surfaces to the front surface;
a second oblique surface coupling the front surface to a second one of the four lateral surfaces opposite to the first lateral surface; and
a third oblique surface coupling the second lateral surface to the rear surface; and
a material at least partially surrounding the photoconversion region, the material having a refraction index smaller than a refraction index of silicon, an interface between the photoconversion region and the material being configured so that the at least one ray reaching the photoconversion region of the pixel undergoes a total reflection or a plurality of successive total reflections at the interface.

2. The image sensor of claim 1 wherein, in each pixel:
a first angle between the first oblique surface and the front surface is greater than a limiting angle of total reflection at an interface between silicon and the material;
a second angle between the second oblique surface and the front surface is greater than the limiting angle; and
a third angle between the third oblique surface and the rear surface is greater than the limiting angle.

3. The image sensor of claim 2 wherein, in each pixel, the first angle is less than 90° minus the value of the limiting angle.

4. The image sensor of claim 2 wherein the photoconversion region of each pixel further comprises a fourth oblique surface coupling the rear surface to the first lateral surface.

5. The image sensor of claim 4 wherein, in each pixel, a fourth angle between the fourth oblique surface and the rear surface is greater than the limiting angle.

6. The image sensor of claim 1 wherein the oblique surfaces are configured so that the successive total reflections occur at the oblique surfaces.

7. The image sensor of claim 6 wherein the first oblique surface is a first one of the oblique surfaces reached by the at least one ray.

8. The image sensor of claim 1, comprising a silicon substrate having a first main surface and a second main surface opposite to the first main surface, wherein:
each photoconversion region corresponds to a portion of the substrate;
the front surface of each photoconversion region corresponds to a portion of the first main surface; and
the rear surface of each photoconversion region corresponds to a portion of the second main surface.

9. The image sensor of claim 1 wherein each pixel comprises a microlens arranged above the rear surface of the photoconversion region of the pixel, the microlens being configured to focus the at least one ray toward the first oblique surface.

10. The image sensor of claim 9 wherein the microlens is configured to focus the at least one ray toward the first oblique surface with a non-zero angle relative to a normal to the rear surface.

11. The image sensor of claim 1 wherein, in each pixel, a layer of the material covers the rear surface of the photoconversion region.

12. The image sensor of claim 1 wherein each pixel further includes an antireflection layer portion on top of or in contact with only a portion of the rear surface of the photoconversion region, the antireflection layer portion being arranged to be crossed by the at least one ray.

13. The image sensor of claim 1 wherein the material is silicon oxide.

14. The image sensor of claim 1 wherein the at least one light ray of each pixel has a wavelength within a range from 700 nm to 1,000 nm.

15. The image sensor of claim 1, further comprising an objective arranged overlying the rear surfaces of the photoconversion regions, opposite the pixels, wherein, for each pixel, the at least one ray corresponds to a chief ray of the pixel.

16. A device, comprising:
a plurality of pixels, each of the pixels including:
a silicon photoconversion region extending laterally between four lateral surfaces, the photoconversion region includes a first oblique surface coupling a first one of the four lateral surfaces to a front surface and a second oblique surface coupling the front surface to a second one of the four lateral surfaces opposite to the first lateral surface; and
a material at least partially surrounding the photoconversion region, the material having a refraction index smaller than a refraction index of silicon, an interface between the photoconversion region and the material being configured to totally reflect radiation incident at the photoconversion region; and
an interconnection structure on and electrically coupled to the plurality of pixels.

17. The device of claim 16 comprising a third oblique surface coupling the second lateral surface to a rear surface opposite to the front surface, wherein the rear surface configured to receive the at least one ray, and the first oblique surface is a first one of the oblique surfaces reached by the at least one ray.

* * * * *